United States Patent [19]

Oppelt et al.

[11] Patent Number: 5,144,241
[45] Date of Patent: Sep. 1, 1992

[54] CIRCULARLY POLARIZING RF ANTENNA FOR AN MRI APPARATUS HAVING A C-MAGNET

[75] Inventors: Ralph Oppelt, Weiher; Wilhelm Duerr; Horst Siebold, both of Erlangen, all of Fed. Rep. of Germany

[73] Assignee: Siemens Aktiengesellschaft, Munich, Fed. Rep. of Germany

[21] Appl. No.: 567,739

[22] Filed: Aug. 15, 1990

[30] Foreign Application Priority Data

Aug. 16, 1989 [EP] European Pat. Off. ........ 89115129.2

[51] Int. Cl.$^5$ ............................................ G01R 33/20
[52] U.S. Cl. ............................................ 324/318
[58] Field of Search ............... 324/322, 318, 309, 313, 324/314; 343/742, 744, 867; 128/653 SC, 653 A

[56] References Cited

U.S. PATENT DOCUMENTS

| | | | |
|---|---|---|---|
| 3,683,389 | 8/1972 | Hollis | 343/867 |
| 4,411,270 | 10/1983 | Damadian | 324/309 |
| 4,766,383 | 8/1988 | Fox et al. | 324/318 |
| 4,812,761 | 3/1989 | Vaughan, Jr. | 324/318 |
| 4,817,612 | 4/1989 | Akins et al. | 324/318 |
| 4,952,878 | 8/1990 | Mens et al. | 324/322 |

FOREIGN PATENT DOCUMENTS 0161782 11/1985 European Pat. Off. .
0256520 2/1988 European Pat. Off. .
8737133 5/1989 Fed. Rep. of Germany .

OTHER PUBLICATIONS

"Resonator Coils for Magnetic Resonance Imaging at 6 MHZ, " Samaratunga et al. Med. Phys. vol. 15, No. 2 Mar./Apr. 1988, pp. 235-240.
"Quadrature Detection Coils-A Further √2 Improvement in Sensitivity", Chen et al. J. Mag. Res. Vol. 54 (1983) pp. 324-327.

*Primary Examiner*—Michael J. Tokar
*Assistant Examiner*—Raymond Y. Mah
*Attorney, Agent, or Firm*—Hill, Van Santen, Steadman & Simpson

[57] ABSTRACT

A circularly polarizing RF antenna suitable for use in an MRI apparatus for obtaining tomograms of an examination subject includes two antenna systems, each having a winding, having two lateral legs and a middle leg, and a return path which form a resonant circuit in combination with one or more resonant capacitors. The middle legs of the two antenna systems are disposed so that they cross one another. One or more decoupling capacitors are provided between the two antenna systems. A circularly polarizing antenna for a magnetic resonance imaging system is thus obtained having a magnetic field vector in the imaging region which rotates in planes parallel to the pole surfaces of a C-shaped magnet which generates the fundamental magnetic field in the magnetic resonance imaging apparatus.

18 Claims, 3 Drawing Sheets

CIRCULARLY POLARIZING RF ANTENNA FOR AN MRI APPARATUS HAVING A C-MAGNET

BACKGROUND OF THE INVENTION

1. Field of the Invention

The present invention is directed to a magnetic resonance imaging apparatus of the type suitable for undertaking diagnostic examinations of a human patient having a body axis extending along the x-axis of a rectangular coordinate system, with the body region to be examined being located between the pole pieces of a magnet forming a fundamental magnetic field extending in the direction of the z-axis, and in particular to an RF antenna for such an apparatus.

2. Description of the Prior Art

The use of magnetic resonance imaging device for producing tomograms, based on the principle of nuclear magnetic resonance, of a body slice, for conducting diagnostics of anatomical joints, and for portraying blood vessels are well known. In such devices, an image is constructed by computational or mensurational analysis of integral proton resonance signals from the spatial spin density, or the relaxation time distribution, of the examination subject. The examination subject, such as a human body, is introduced into a strong, uniform magnetic field, referred to as the fundamental or basic field, which aligns the nuclear spins in the examination subject. Gradient coils are provided which each generate a spatially differently oriented magnetic field. An RF antenna excites the nuclear spins in the examination subject, and transmits the resulting signal emitted by the excited nuclear spins to a receiver. The RF antenna is usually connected to a transmitter and to a receiver via matching capacitors as well as via a transmission/reception diplexer. Whereas the maximum transmission power in such a device is established by the load limit of the components, the maximum, mean transmission power is essentially limited by the level of heating which can be withstood by the patient.

As is known, circularly polarizing antennas require a low transmission power. These antennas have the advantage of essentially producing only field components effective for the nuclear magnetic resonance, for example the counter-clockwise field components. For example, such an antenna may consist of two linearly polarizing antenna systems arranged orthogonally relative to each other and connected to a transmitter and to a receiver via a 90° directional coupler. The transmission signal which is fed to the antenna is supplied directly to one of the antenna systems, and is supplied with a 90° phase shift to the other antenna system, so that a rotating field is generated which is effective for conducting nuclear magnetic resonance tomography. In the reception mode, the antenna represents two signal sources phase-shifted by 90° and also represents two uncorrelated noise sources. The 90° directional coupler supplies the in-phase sum of the signals to a receiver. Such an antenna is described in the Journal of Magnetic Resonance, Vol. 54 (1983) at pages 324–327.

Generally, the fundamental static magnetic field is generated in the direction of the a. c. axis of the patient. Such magnets are generally executed as solenoid magnets, which are superconducting for stronger magnetic fields above 0.5 T. It is also known to employ a fundamental field magnet in a magnetic resonance tomography apparatus wherein the fundamental field extends perpendicularly relative to the a. c. axis of the patient, i.e., in the direction of the z-axis of a rectangular coordinate system. Such a fundamental field magnet is disclosed in European Application 0 161 782.

The fundamental field magnet is provided with pole pieces which limit the imaging volume, and between which the uniform fundamental field is to be generated. The pole pieces may be connected to each other via the common yoke of a permanent magnet or an electromagnet, and thus form what is known as a C-magnet. Such a structure is disclosed in German OS 37 37 133.

SUMMARY OF THE INVENTION

It is an object of the present invention to provide a circularly polarizing RF antenna suitable for use in a magnetic resonance imaging tomography apparatus wherein a C-magnet is employed in the apparatus for generating the fundamental magnetic field.

The above object is achieved in a magnetic resonance imaging tomography apparatus having a circularly polarized RF antenna consisting of two antenna systems, each antenna system being in the form of an open winding. Each winding includes a middle leg proceeding substantially parallel to one of the pole surfaces of the C-magnet of the apparatus, two lateral legs, and a return path. Each winding has a resonant capacitor which, in combination with the winding, forms a resonant circuit. The windings are arranged so that their middle legs cross one another. At least one decoupling capacitor is provided between the two antenna systems. A circularly polarizing RF antenna is thereby achieved wherein the magnetic field vector rotates in a set of planes wherein $z = a$ constant in the imaging volume between the pole pieces of the fundamental field magnet.

The windings are preferably in the form of a conductive band or ribbon, particularly in the form of a thin coating which can be applied on a carrier. The lateral legs are preferably disposed relative to the middle leg so as to be parallel to the x-z plane.

In one embodiment of the antenna, an electrically conductive ground surface can be provided as common return for the two windings. The antenna is connected to a transmitter and to a receiver via matching capacitors which are connected between the inner conductor of a coaxial conductor, and the connection of one of the lateral legs to the allocated resonant capacitor. The shielding of this coaxial conductor is preferably connected approximately in the midpoint between the terminal points of the resonant capacitors at the ground side.

Decoupling capacitors are preferably connected to the lateral legs of the antenna via ribbon-shaped connecting conductors. These capacitors allow an exact compensation of potential intrinsic couplings of the two antenna system so that they are completely decouped from one another. A current flowing in one antenna system does not produce any current flux in the other antenna system.

In a further embodiment, two resonant capacitors are provided for each of the antenna systems. One of these resonant capacitors is arranged between the lateral legs and the return path for the circuit. In this embodiment, one of the resonant capacitors may be a variable capacitance.

The ends of the lateral legs of the various windings are arranged following each other in the direction of the y-axis, and are preferably connected to each other via a decoupling capacitor. Further, those ends of the lateral legs of the windings arranged following each other in the direction of the x-axis can be connected to each other via a decoupling capacitor. The location and magnitude of these decoupling capacitors is dependent on the design and arrangement of the windings of the two antenna systems.

At least the pole surfaces of the fundamental field magnet and the surface of the yoke of the fundamental field magnet which faces toward the imaging volume between the pole surfaces are preferably provided with a shielding consisting of electrically conductive material, such as copper. The entire poles as well as the middle leg of the fundamental field magnet may also be provided with such a shielding, as may the entire interior surface of the installation room containing the apparatus.

Under certain circumstances, it may be desirable to provide an electrically conductive connection consisting of non-magnetic material between the clad pole surfaces in the proximity of the outside edge of the fundamental field magnet disposed opposite the iron yoke. A closed envelope around the RF antenna arises with such a connection. This connection shortens the path of the ring current which is induced in the shielding by the RF antenna. Without this connection, this current would close at the inside surfaces of the room in which the apparatus is located, if those inside surfaces were lined with electrically conductive material.

DESCRIPTION OF THE PREFERRED EMBODIMENTS

Figure 1:
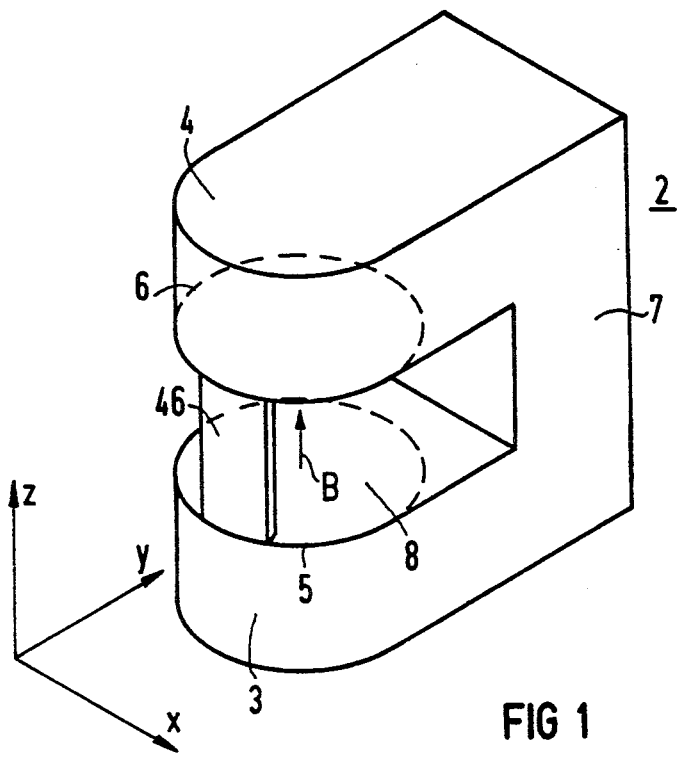
FIG. 1 is a schematic perspective view of a C-magnet suitable for use as a fundamental field magnet in a magnetic resonance tomography apparatus.

A C-magnet 2 is shown in FIG. 1 suitable for use in a magnetic resonance imaging tomography apparatus for generating the static, fundamental magnetic field in a direction proceeding parallel to the z-axis of a rectangular coordinate system, also shown in the drawing. Such a magnetic resonance imaging tomography apparatus can be used, for example, for examining a human body having an a.c. axis extending along the x-axis of the coordinate system, and having a body region to be examined disposed in an imaging volume 8 between the pole pieces 3 and 4 of the magnet 2. In the embodiment shown in FIG. 1 at least the pole surfaces 5 and 6, indicated by dashed lines, are provided with a shielding for the RF field, such shielding consisting of electrically conductive material, such as cooper. In addition to the pole surfaces 5 and 6, the entire poles 3 and 4 as well as the yoke 7 may be provided with such a shielding.

The origin of the coordinate system preferably lies at the center of the imaging volume 8 between the pole surfaces 5 and 6. The coordinate system is shown in FIG. 1 located outside of the imaging volume 8 only for clarity.

Figure 2:
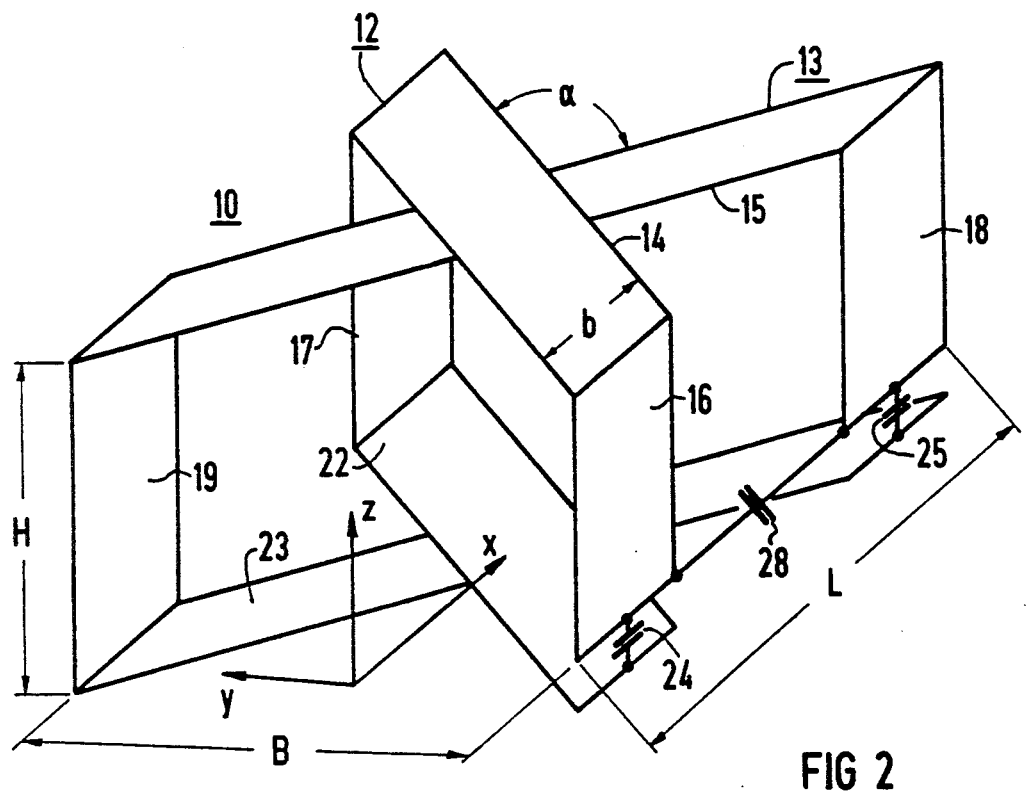
FIG. 2 is a schematic perspective view of an RF antenna constructed in accordance with the principles of the present invention suitable for use in a magnetic resonance imaging tomography apparatus.

A circularly polarizing RF antenna 10 is arranged in the imaging volume 8, the antenna 10 consisting of two antenna systems 12 and 13, as shown in FIG. 2. The antenna system 12 is in the form of an open winding having a middle leg 14, two lateral legs 16 and 17, and a return 22 proceeding parallel to the middle leg 14. The inductance of this winding forms a resonant circuit with a resonant capacitor 24.

The antenna system 13 is in the form of a winding including a middle leg 15, lateral legs 18 and 19 and a return 23. The inductance of this winding forms a resonant circuit with a resonant capacitor 25. The respective capacitances of the capacitors 24 and 25 are preferably variable, the capacitors 24 and 25 preferably being formed by the combination of fixed-value capacitor and a variable capacitor.

The antenna systems 12 and 13 are disposed such that the respective middle legs 14 and 15 cross. The antenna systems 12 and 13 form an angle $\alpha$ which is in the range of approximately 80° through 90°, and is preferably in the range of approximately 86° through 88°. The size of the angle $\alpha$ is dependent on the position and on the width of the conductors forming the antenna systems 12 and 13. The conductors may, for example, be conductive bands or ribbons having a width $b=100$ mm. If the antenna systems 12 and 13 are to form a whole-body antenna, each system will have a length L of approximately 600 mm, a width B of approximately 500 mm and a height H of approximately 360 mm.

For decoupling the antenna systems, a decoupling capacitor 28 is connected preferably between at least two ends of the vertical legs of the respective antenna systems disposed opposite each other. The decoupling capacitor 28 will be connected between the lateral leg ends to which a resonant capacitor is also connected. In the illustrated embodiment of FIG. 2, the decoupling capacitor 28 is disposed between the ends of the lateral legs 16 and 18.

If the decoupling capacitor 28 is arranged, for example, between the legs 16 and 19, the resonant capacitor 25 will then be disposed between the end of the leg 19 and the return 23, in which case the leg 18 will be directly connected to the return 23. In an similar manner, the decoupling capacitor 28 may be arranged, for example, between the legs 17 and 19 or between the legs 17 and 18. A circularly polarizing antenna is thus obtained for magnetic resonance imaging tomography apparatus having a fundamental magnetic field having a magnetic field strength between approximately 0.1 and 0.4 T.

Figure 3:
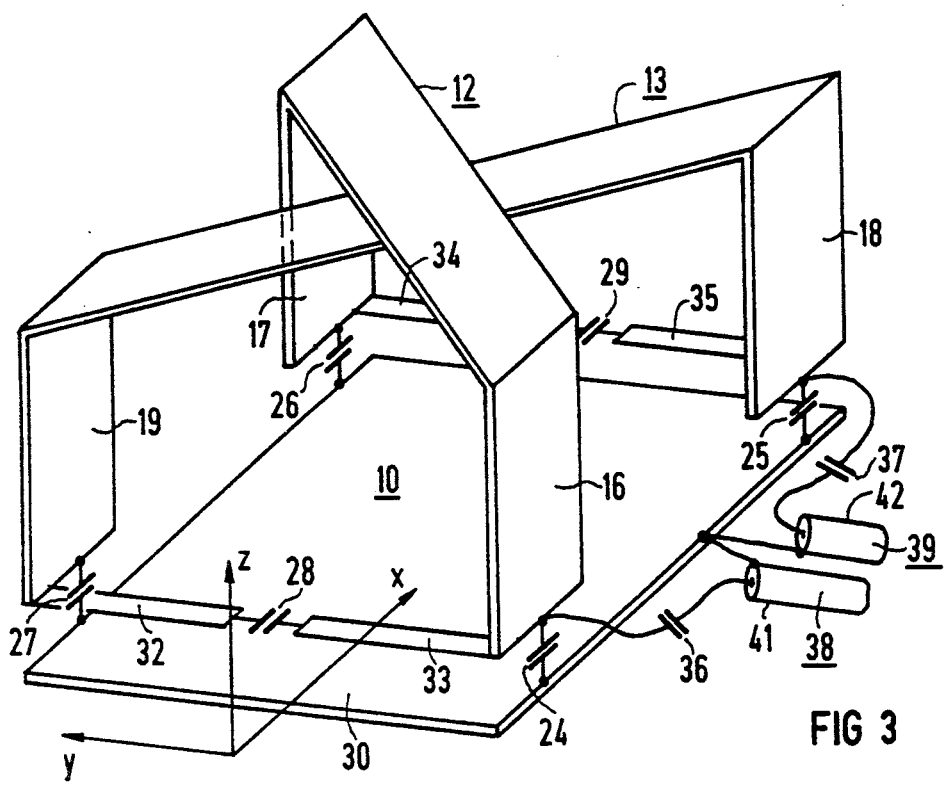
FIG. 3 is a perspective view of a further embodiment of an RF antenna constructed in accordance with the principles of the present invention.

In another embodiment of the antenna 10 as shown in FIG. 3, the antenna systems 12 and 13 consist of metallic conductor bands which are arranged on a carrier (not shown in the drawing). The conductor bands may consist of a thin coating on the carrier, the coating having a thickness which does not significantly exceed 300 $\mu$m, and preferably is at most 100 $\mu$m, and is more specifically approximately twice the skin depth, i.e., approximately 35 $\mu$m. This coating is then applied to a flat carrier consisting of plastic, for example by vapor-deposition or by gluing.

In the embodiment of FIG. 3, the antenna systems 12 and 13 are provided with a common return formed by a grounding surface 30. The grounding surface 30 may similarly consist of a thin coating of electrically conductive material, preferably copper, applied to a carrier and having a thickness which is preferably approximately the same size as the thickness of the conductor bands of the middle and lateral legs. Because the human body will be introduced into the imaging volume 8 limited by the grounding surface 30 and by the antenna systems 12 and 13, those components will be provided with cladding, which are not specifically shown in the drawing.

The ends of the lateral legs 16 through 19 are preferably aligned approximately parallel to the x-axis, and thus approximately parallel to the side edge of the grounding surface 30. In addition to the decoupling capacitor 28 arranged between the ends of the legs 16 and 19, a further decoupling capacitor 29 is preferably provided between the ends of the lateral legs 17 and 18. These decoupling capacitors 28 and 29 are preferably connected via conductors to the allocated legs 16 through 19, the connecting conductors preferably consisting of conductor bands or ribbons, also in the form of thin films on a carrier, referenced 32 through 35 in FIG. 3. In the embodiment of FIG. 3, two further resonant capacitors 26 and 27 in addition to the resonant capacitors 24 and 25 are provided. The further resonant capacitors 26 and 27 are arranged between the ends of the lateral legs 17 and 19 and the grounding surface 30.

Connection of the antenna 10 to a transmitter and receiver (not shown in the drawing) preferably ensues via matching capacitors 36 and 37 which are connected to the inner conductor of respective coaxial cables 38 and 39. The shieldings 41 and 42 of the respective coaxial conductors 38 and 39 are connected to the grounding surface 30. The shieldings 41 and 42 are preferably connected with short connecting lines to the grounding surface 30, approximately at a midpoint between the respective connections of the capacitors 24 and 25.

Figure 4:
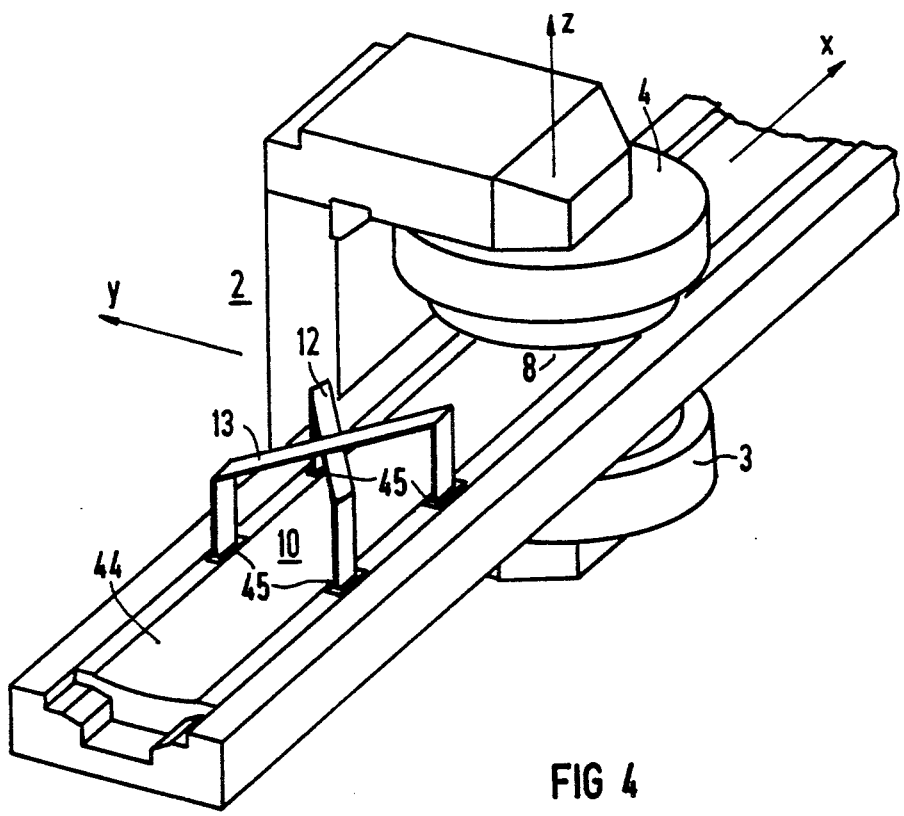
FIG. 4 is a perspective view of the RF antenna and the C-magnet arranged in combination in a magnetic resonance imaging apparatus.

As can be seen in FIG. 4, the antenna systems 12 and 13 of the antenna 10 are secured to a base 44 which is displaceable in the direction of the x-axis, and which may also be laterally displaceable in the direction of the y-axis. Together with an examination subject, the antenna 10 is conveyed between the poles 3 and 4 of the fundamental field magnet so that a body region to be examined is situated in the imaging volume 8 together with the antenna 10 surrounding the body region.

To facilitate placement of the patient in the antenna 10, the antenna 10 may be equipped with plugs respectively disposed at the ends of the lateral legs 16 and 19, so that those legs (or the capacitors at the respective ends thereof) can be plugged into mating receptacles in the grounding surface 30. Such plug connections are schematically indicated at 45. The antenna 10 may be provided with hinges or a pivoting mechanism with the legs 14 and 15 being divided and laterally swivelable at the midpoints for opening the antenna to permit the introduction of an examination subject. It is also possible to provide a hinge at the ends of two of the lateral legs with the ends of the other legs being equipped with the aforementioned plug connection.

Preferably the room in which the magnetic resonance imaging apparatus is installed will be provided with shielding, as will the fundamental field magnet 2. The shielding may consist, for example, of a metal foil on a carrier, the foil having a thickness of preferably at most 100 $\mu$m, and preferably in the range of approximately 36 through 50 $\mu$m. Under some circumstances, solid metal plates may be used as the shielding.

If the magnetic resonance imaging apparatus and the installation room are shielded in this manner, the pole surfaces 5 and 6 are preferably provided with an electrically conductive connection 46 at the outside edges thereof lying opposite the yoke 7. This connection constitutes a short circuit path for the ring current which will be induced by the antenna 10 on the pole surfaces 5 and 6 and the conductive shielding inside the installation room.

With a spacing of the pole surfaces 5 and 6 of, for example, approximately 400 mm, and the aforementioned length of the lateral legs 16 through 19 of approximately 360 mm, the spacing of the middle legs 14 and 15 from the upper pole surface 6, and the spacing of the returns 22 and 23 from the lower pole surface 5, will be approximately 20 mm. The respective pole surfaces 5 and 6 provided with an electrically conductive coating as shielding are relatively large in comparison to the conductor bands of the antenna 10. Because the grounding surface 30 proceeds just above the lower pole surface 5, and the horizontal middle legs 14 and 15 proceed just under the upper pole surface 6, a high-frequency current which flows in the lateral legs 16 through 19 of the antenna 10 appears virtually to continue to infinity, in accordance with the mirror current principle. Additionally, because the operating wavelength of the antenna 10 is much larger than the spacing between the pole surfaces 5 and 6, the amplitude of the currents in the lateral legs 16 through 19 in z-direction will be practically independent of the coordinate z, so that the RF field generated by the antenna 10 is uniform in this direction. As a further result of the mirror current principle, the currents in the returns 22 and 23, or in the grounding surface 30, and the middle legs 14 and 15 induce oppositely directed currents in the respectively immediately adjacent, pole surface 5 or 6. The currents in the shielding of the pole surfaces 5 and 6 behave as though a current loop were present having currents in a direction opposite to the current direction in the middle legs 14 and 15 the magnitude of this horizontally flowing surface current, which has many harmful field components parallel to the fundamental magnetic field, disappears at a short distance from the conductor bands of the middle legs 14 and 15 of the antenna 10.

Figure 5:
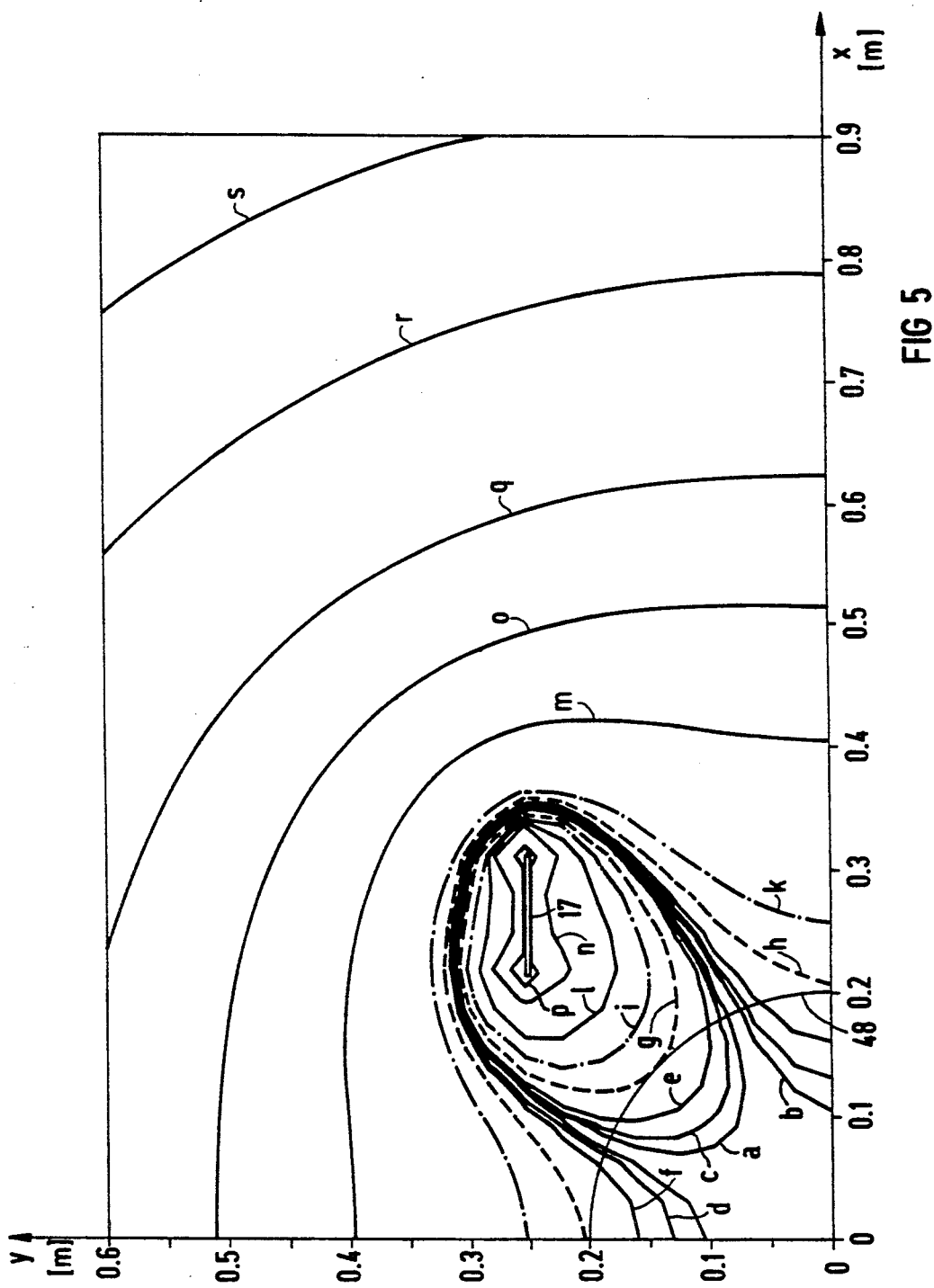
FIG. 5 is a graph showing a quadrant of the circularly polarized RF field in the imaging volume generated by the RF antenna in accordance with the principles of the present invention.

The graph of FIG. 5 shows the distribution of the circular portion of the magnetic field which is effective for nuclear magnetic resonance tomography in the imaging volume 8 in the plane z=0. This field is shown in an isoline illustration. As a result of the two mirror planes x=0 and y=0, only one quadrant is shown, the quadrant having the plane z=0 in which, for example, the lateral leg 17 is intersected. The distance of the contour lines a through s from the origin x=0 and y=0 on the y-axis and on the x-axis is set forth in meters m. The optimum intersecting angle $\alpha$ is 87.8° in this embodiment.

The contour lines a through s in FIG. 5 have the following allocated level of the fundamental field strength:

| REFERENCE | LEVEL |
| --- | --- |
| a | 1.01 |
| b | 0.99 |
| c | 1.02 |
| d | 0.98 |
| e | 1.04 |
| f | 0.96 |
| g | 1.10 |

| REFERENCE | LEVEL |
| --- | --- |
| h | 0.90 |
| i | 1.20 |
| k | 0.80 |
| l | 1.40 |
| m | 0.40 |
| n | 2.00 |
| o | 0.20 |
| p | 4.00 |
| q | 0.10 |
| r | 0.04 |
| s | 0.02 |

The contour lines g and h represent respective deviations of +10% and −10% from the central value of the fundamental magnetic field and are shown in dashed lines in FIG. 5. The contour lines i and k represent respective deviations of +20% and −20% from the central value, and are indicated with dot-and-dash lines in the FIG. 5.

An approximately cylindrical region 48 having a diameter of about 400 mm, which is indicated in FIG. 5 by an arc of a circle, is as uniform as required for obtaining an image using nuclear magnetic resonance tomography techniques. Outside of the region 48, particularly along the x-axis along which the patient extends, the field strength of the RF field decreases relatively quickly, so that no undesired noise from the patient can be coupled in. In the examination of a relatively broad-shouldered patient, the patient may place his arms outside of the two antenna systems 12 and 13. If an examination is needed precisely at the height of the shoulders, the arms may be extended through the lateral openings in the direction of the y-axis. Given rotating drive with approximately 1 mT flux density per 102 A of current amplitude in the two antenna systems 12 and 13, the antenna 10 has a good sensitivity.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance imaging tomography apparatus for examining a subject extending along the x-axis of a rectangular coordinate system and having a magnet for generating a fundamental magnetic field extending in the direction of the z-axis, said magnet having spaced pole surfaces connected by a yoke and defining an examination volume therebetween in which a region to be examined of said subject is disposed, the improvement of a circularly polarized RF antenna comprising:

first and second antenna systems each in the form of a loop;

each of said first and second antenna systems including a middle leg disposed approximately parallel to one of said pole surfaces, two lateral legs connected to said middle leg, and a return path, said return path being electrically connected to the end of a first of said lateral legs in its antenna system, and being connected via a resonant capacitor to the end of a second of said lateral legs in its antenna system;

said loops of said first and second antenna systems being disposed so that said middle legs cross; and at least one decoupling capacitor connected between said first and second antenna systems.

2. The improvement of claim 1 wherein said middle leg and said lateral legs of each of said first and second antenna systems consist of a conductor band.

3. The improvement of claim 1 wherein said lateral legs of each of said first and second antenna systems are disposed substantially parallel to the x-z plane of said rectangular coordinate system.

4. The improvement of claim 1 wherein said return path is formed by a conductor band connected between the end of said first of said lateral legs and said resonant capacitor in each antenna system.

5. The improvement of claim 1 wherein the return path for each of said first and second antenna systems is formed by a common electrically conductive grounding surface connected to said resonant capacitor of each of said first and second antenna systems.

6. The improvement of claim 5 further comprising first and second coaxial conductors adapted for respectively connecting said first and second antenna systems to other components in said magnetic resonance imaging tomography apparatus, each coaxial conductor having an inner conductor and shielding, and said improvement further comprising a first matching capacitor connected between said inner conductor of said first coaxial conductor and the lateral leg of said first antenna system to which said resonant capacitor is connected, and a second matching capacitor connected between the inner conductor of said second coaxial conductor and the lateral leg of said second antenna system to which said resonant capacitor is connected.

7. The improvement of claim 6 further comprising an electrical connection between the shielding of each of said first and second coaxial conductors and an approximate midpoint of said electrically conductive grounding surface between the respective connections of said resonant capacitors of said first and second antenna systems to said grounding surface.

8. The improvement of claim 1 further comprising an additional resonant capacitor in each of said first and second antenna systems connected between the end of the first lateral leg of each antenna system.

9. The improvement of claim 1 wherein said resonant capacitors in said first and second antenna systems have a variable capacitance.

10. The improvement of claim 1 wherein said decoupling capacitor is connected between the ends of respective lateral legs in said first and second antenna systems disposed next to each other.

11. The improvement of claim 10 further comprising first and second conductor bands respectively connected between said respective lateral legs and said decoupling capacitor.

12. The improvement of claim 1 further comprising:
   an electrically conductive shielding covering said pole surfaces and a surface of said yoke facing said imaging volume.

13. The improvement of claim 12 further comprising an electrically conductive connection between the shielding of said pole surfaces, said electrically conductive connection extending between said pole surfaces substantially opposite said yoke.

14. The improvement of claim 1 wherein said return paths of said first and second antenna systems are formed by a common electrically conductive grounding surface connected to said at least one resonant capacitor in each of said first and second antenna systems, and further comprising a plug connection between each of said resonant capacitors and said grounding surface.

15. The improvement of claim 1 wherein said respective middle legs of said first and second antenna systems cross at an angle in the range between approximately 80° and approximately 90°.

16. The improvement of claim 1 wherein said respective middle legs of said first and second antenna systems cross at an angle in a range between approximately 86° and approximately 88°.

17. In a magnetic resonance imaging tomography apparatus for examining a subject extending along the x-axis of a rectangular coordinate system and having a magnet for generating a fundamental magnetic field extending in the direction of the z-axis, said magnet having spaced pole surfaces connected by a yoke and defining an examination volume therebetween in which a region to be examined of said subject is disposed, the improvement of a circularly polarizing RF antenna comprising:

first and second antenna systems each in the form of a loop;

each of said first and second antenna systems including a middle leg disposed approximately parallel to one of said pole surfaces, two lateral legs connected to said middle leg, and a return leg electrically connected to the end of a first of said lateral legs in its antenna system and connected to the end of a second of said lateral legs in its antenna system via a resonant capacitor, said middle leg, said lateral legs and said return leg each being formed by a conductor band;

said loops of said first and second antenna systems being disposed so that said middle legs cross; and a decoupling capacitor connected to a lateral leg of each of said antenna systems.

18. In a magnetic resonance imaging tomography apparatus for examining a subject extending along the x-axis of a rectangular coordinate system and having a magnet for generating a fundamental magnetic field extending in the direction of the z-axis, said magnet having spaced pole surfaces connected by a yoke and defining an examination volume therebetween in which a region to be examined of said subject is disposed, the improvement of a circularly polarizing RF antenna comprising:

first and second antenna systems each in the form of a loop;

each of said first and second antenna systems including a middle leg disposed approximately parallel to one of said pole surfaces, two lateral legs connected to said middle leg, and a return path, and a resonant capacitor connected between each lateral leg of each antenna system and said return path;

said middle leg and said lateral legs of each of said first and second antenna systems consisting of conductor bands;

said return paths for said first and second antenna systems being formed by a common electrically conductive grounding surface connected to each of said resonant capacitors;

said loops of said first and second antenna systems being disposed so that said middle legs cross; and a first decoupling capacitor connected between a lateral leg of said first antenna system and a lateral leg of said second antenna system, and a second decoupling capacitor connected between the other lateral leg of said first antenna system and the other lateral leg of said second antenna system.

* * * * *